United States Patent [19]

Engler et al.

[11] 4,360,583
[45] Nov. 23, 1982

[54] HIGH RESOLUTION VIDEO STORAGE DISK

[75] Inventors: Edward M. Engler, Wappingers Falls; Frank B. Kaufman, Ossining; Steven R. Kramer, Katonah; Bruce A. Scott, Pleasantville, all of N.Y.

[73] Assignee: International Business Machines Corporation, Armonk, N.Y.

[21] Appl. No.: 216,341

[22] Filed: Dec. 15, 1980

[51] Int. Cl.$^3$ .............................................. G03C 1/00
[52] U.S. Cl. ................................... 430/270; 430/344; 430/945; 430/925
[58] Field of Search ............... 430/344, 945, 325, 270, 430/292, 916, 925

[56] References Cited

U.S. PATENT DOCUMENTS

| | | | |
|---|---|---|---|
| 4,036,648 | 7/1977 | Engler et al. | 430/344 |
| 4,082,552 | 4/1978 | Engler et al. | 430/344 |
| 4,142,783 | 3/1979 | Engler et al. | 350/357 |

OTHER PUBLICATIONS

R. A. Bartolini et al., "Review and Analysis of Optical Recording Media", Optical Engineering, vol. 15, No. 2, pp. 99–108, (1976).
N. Narita et al., "Preparation of Tetrathiafulvalenes (TTF) and Their Selenium Analog: Tetraselenafulvalenes (TSeF)", Synthesis pp. 489–514, Aug. 1976.

Primary Examiner—Won H. Louie, Jr.
Attorney, Agent, or Firm—Joseph G. Walsh

[57] ABSTRACT

The invention relates to high resolution video storage disks comprising a substrate having disposed thereon a film of a monofunctionalized substituted tetraheterofulvalene compound and a halocarbon. The tetraheterofulvalene compound can have the molecular formula

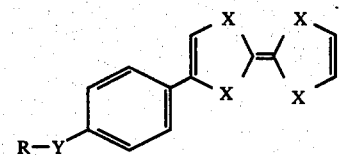

where X can be S and/or Se
R can be an alkyl group having from about 1 to about 8 carbon atoms or a benzyl group wherein said benzyl group can be a part of a polymer chain; and Y can be either an ester or an ether.

8 Claims, No Drawings

HIGH RESOLUTION VIDEO STORAGE DISK

BACKGROUND OF THE INVENTION

1. Field of the Invention

This invention relates to video storage disks and the method of preparing the same.

2. Prior Art

Present day video storage disks are used to receive optically transmitted information which can be stored in thin film layers of radiation or thermal sensitive materials. The stored information can be read by optical techniques.

Typically, these disks are comprised of a substrate having disposed thereon radiation sensitive materials such as chalcogenide glasses or polymeric films having dyes embedded therein (for a comprehensive review of optical storage media see R. A. Bartolini et al, "Review and Analysis of Optical Recording Media", Optical Engineering, Vol. 15, No. 2, pages 99–108, 1976). In these disks the adsorption of actinic radiation causes a hole or crevice to be formed in the irradiated region. These deformations are optically read. Other materials employed in video disks undergo photochromism when exposed to actinic radiation. For example, azo-based dyes in a polymer matrix are coated on a substrate. When exposed to actinic radiation these dyes undergo absorption spectrum changes which can be fixed chemically to provide optically patterned information.

Although present day video storage materials have proven adequate that they have not met all the necessary property requirements necessary for video disk applications. For example, materials in order to be useful as video disk imaging media must have:
1. the ability to optically receive video information;
2. the ability to store this information in high density, e.g., on the order of 1 micron images;
3. provide high optical contrast between data images and background;
4. be capable of absorbing suitable wavelength for detection of the stored information;
5. have appropriate mechanical properties, such as being capable of strongly adhering to substrates and having uniform film forming properties; and
6. they must have long term stability of the stored video information.

What has been discovered here is a class of materials which meet all of the above requirements. These materials are modified tetraheterofulvalene derivatives. The materials disclosed herein are found to provide high resolution video storage, i.e., better than 1 micron optically detectable images.

SUMMARY OF THE INVENTION

The invention provides a novel high resolution video media and a method for preparing the same. The media are comprised of a substrate having coated thereupon a layer of film of a monofunctionally substituted tetraheterofulvalene.

DESCRIPTION OF THE INVENTION

Tetraheterofulvalenes and similar donor compositions are well known. It is also known that they are optically active in the presence of a halocarbon as taught in U.S. Pat. Nos. 4,036,648 and 4,082,552. These patents describe certain of these materials and their usefulness in printing applications. In copending applications Ser. Nos. 083,491, 083,495 and 083,496, filed on Oct. 10, 1979, assigned to a common assignee, there is disclosed the use of tetraheterofulvalene materials as resist materials in high resolution lithography. There is no teaching however, of the specific compositions disclosed hereinafter or of their use as media for video storage.

The materials contemplated for use in this invention include tetraheterofulvalenes having a monofunctionalized substituent in combination with a halocarbon. These materials have glass-like film forming properties. These materials are soluble in a wide range of solvents which makes them suitable for spin coating.

More specifically the tetraheterofulvalene derivatives contemplated for use in this invention have the following molecular formula.

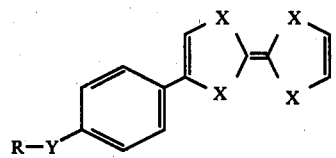

where X is selected from S and/or Se; R can be an alkyl group having from about 1 to 8 C atoms, or a benzyl group. The benzyl group can be a part of a polymer chain. Y can be selected from an ether or ester group.

Specific compositions which can be successfully used in the present invention include
p-methoxy phenyl tetrathiafulvalene
p-ethoxy phenyl tetrathiafulvalene
p-propoxy phenyl tetrathiafulvalene
p-butoxyphenyltetrathiafulvalene
p-pentoxy phenyl tetrathiafulvalene
p-hexoxy phenyl tetrathiafulvalene
p-heptoxy phenyl tetrathiafulvalene
p-octoxy phenyl tetrathiafulvalene
poly(p-methylenoxy-(p-phenyltetrathiafulvalene) styrene)
p-methoxyphenyl traselenafulvalene
p-ethoxy phenyl traselenafulvalene
p-propoxy phenyl traselenafulvalene
p-butoxyphenyl traselenafulvalene
p-pentoxy phenyl traselenafulvalene
p-hexoxy phenyl traselenafulvalene
p-heptoxy phenyl traselenafulvalene
p-octoxy phenyl traselenafulvalene
poly(p-methylenoxy-(p'-phenyl tetraselenafulvalene) styrene)
p-carbomethoxyphenyltetrathiafulvalene
p-carboethoxy phenyl tetrathiafulvalene
p-carbopropoxy phenyl tetrathiafulvalene
p-carbo butoxy phenyl tetrathiafulvalene
p-carbo pentoxy phenyl tetrathiafulvalene
p-carbo hexoxy phenyl tetrathiafulvalene
p-carbo heptoxy phenyl tetrathiafulvalene
p-carbo octoxy phenyl tetrathiafulvalene
poly(p-carboxy-(p'-phenyltetrathiafulvalene)styrene)
p-carbomethoxyphenyltetraselenafulvalene
p-carboethoxy phenyl tetraselenafulvalene
p-carbopropoxy phenyl tetraselenafulvalene
p-carbo butoxy phenyl tetraselenafulvalene
p-carbo pentoxy phenyl tetraselenafulvalene
p-carbo hexoxy phenyl tetraselenafulvalene
p-carbo heptoxy phenyl tetraselenafulvalene
p-carbo octoxy phenyl tetraselenafulvalene poly(p-carboxy-(p'-phenyltetraselenafulvalene)styrene)

The halocarbons chosen for the purposes of this invention include those which have a high electron affinity for photo-reactions with the above tetraheterofulvalene derivatives. Typically, they are selected from $CCl_4$, $CBr_4$, $C_2Cl_6$, $C_2Cl_2Br_4$, $C_3Br_4H_4$, $C_2Br_2Cl_4$, $C_2H_2Cl_4$, $C_2Br_6$, $C_3Cl_8$, $CHBr_3$, and the like.

The halocarbon is present in the composition in amounts ranging from 0.05–0.5 times the concentration of the tetraheterofulvalene.

The sensitivity and the resolution of image development depends a great deal on the purity of the components of the composition as well as the mole ratio of the halocarbon to the tetraheterofulvalene. Typically, this mole ratio is maintained in a range of from about 0.1 to about 0.2.

Solvents which can be used include toluene, chloroform, methylene chloride, tetrahydrofuran, methylethylketone and the like. The specific solvent used depends on the solubility characteristic of the specific tetraheterofulvalene and on the desired film thickness.

Films are generally prepared by the well known spin casting technique. However, dip coating techniques can similarly be used.

The tetraheterofulvalene derivatives can be prepared by known synthetic procedures. Typical procedures are described in the article to M. Narita et al entitled "Preparation of Tetrathiafulvalenes (TTF) and Their Selenium Analog: Tetraselenafulvalenes (TSeF)", *Synthesis* 489 (1979) and in U.S. Pat. No. 4,142,783. The procedures disclosed therein are incorporated here by reference.

Suitable substrates upon which the compositions can be cast include glass, plastic, quartz, mylar and the like.

Exposure of the video media disks were performed by using 200 watt Hg lamp in conjunction with a preco contact printer. The lamp output was 40 mw/cm² in the plane of the wafer. A dichroic mirror is used during exposure to absorb infrared radiation. The lamp provides radiation in the range of 3000 Å to 5000 Å. The disks are exposed for times from about 10 seconds to about 120 seconds.

After exposure of the video disk in the presence of a mask an image is developed by removing the unexposed areas with a non-polar solvent. Suitable developing solvents include tetrahydrofuran, chloroform, toluene, methylethylketone, methylene chloride, and the like.

The developed images show no evidence of solvent induce distortions or loss of resolution. This unlike the prior art video disk materials where solvent induce distortion is a serious problem.

The films show strong absorptions in the ultraviolet and visible regions of the spectrum i.e., from about 9,000 Å to about 2,000 Å. These absorptions can be detected by a laser reading system as a means for reading the written video information on the exposed disks.

EXAMPLES

The following Examples are by way of demonstration and should in no way deem to be by way of limitation.

EXAMPLE 1

Films are spin casted onto a substrate from a solution containing 15 mg of p-methoxyphenyltetrathiafulvalene and 1 mg of $CBr_4$ in about 50 µl of dry tetrahydrofuran. A film of about 1 micron thickness is deposited in this way.

The film is exposed through a mask with a 200 watt Hg lamp for about 20 seconds. After exposure an image was developed by immersing the film in tetrahydrofuran for about 30 seconds. The developed images absorb with a maximum at 6500 Å and possess an optical density difference of 0.8. Other absorptions at 8000 Å and 18,000 Å are also observed.

EXAMPLE 2

The procedure disclosed in Example 1 was repeated except that about 50 mg of poly(p-methylenoxy-(p'-phenyltetrathiafulvalene) styrene and 5 mg of $C_2Br_2Cl_4$, dissolved in 100 µl of dry tetrahydrofuran, was spin casted onto a suitable substrate. An image was developed by immersing the exposed film in methylethyl ketone. Optical absorptions with maximum at 6500 Å, 8000 Å and 18,000 Å were observed.

EXAMPLE 3

The procedure of Example 1 is again repeated except that about 25 mg of p-carbomethoxyphenyltetrathiafulvalene and 2.0 mg of $CBr_4$ dissolved in 100 µl to toluene is spin casted onto a suitable substrate. An image was developed by immersing the exposed film onto methylene chloride. Optical absorptions with maxima at 6800 Å, 8000 Å and 18,500 Å were observed.

EXAMPLE 4

The procedure of Example 1 is again repeated except that 10 mg of p-methoxyphenyltetraselenafulvalene and 1 mg of $C_2Br_2Cl_4$ are dissolved in 50 µl of tetrahydrofuran. An image is developed in the exposed film by immersing it in methyl ethyl ketone. Optical absorptions with maxima at 7400 Å, 9,000 Å and 18,000 Å are observed.

Having thus described out invention, what we claim as new, and desire to secure by Letters Patent is:

1. A high resulution video storage disk comprising a substrate having disposed thereon a monofunctionally substituted tetraheterofulvanene and a halocarbon having a high electron affinity for photo-reaction with said monofunctionality substituted tetraheterofulvalene, wherein said monofunctionally substituted tetraheterofulvalene having the molecular structure of:

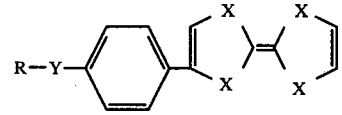

wherein
X is selected from the group consisting of S and Se;
R is selected from the group consisting an alkyl group having from about 1 to about 8 carbon atoms, benzyl, and a benzyl group which is part of a polymer chain; and
Y is selected from the group consisting of an ester or ether group.

2. Video storage disks according to claim 1 wherein said halocarbon is selected from the group consisting of $CCl_4$, $CBr_4$, $C_2Cl_6$, $C_2Cl_2Br_4$, $C_3Br_4H_4$, $C_2Br_2Cl_4$, $C_2H_2Cl_4$, $C_2Br_6$, $C_3Cl_8$ and $CHBr_3$.

3. Video storage disks according to claim 2 wherein said monofunctionally substituted tetraheterofulvalene is selected from the group consisting of
p-methoxy phenyl tetrathiafulvalene
p-ethoxy phenyl tetrathiafulvalene
p-propoxy phenyl tetrathiafulvalene
p-butoxyphenyltetrathiafulvalene
p-pentoxy phenyl tetrathiafulvalene
p-hexoxy phenyl tetrathiafulvalene
p-heptoxy phenyl tetrathiafulvalene
p-octoxy phenyl tetrathiafulvalene
poly(p-methylenoxy-(p'-phenyltetrathiafulvalene) styrene)
p-methoxyphenyl traselenafulvalene
p-ethoxy phenyl traselenafulvalene
p-propoxy phenyl traselenafulvalene
p-butoxyphenyl traselenafulvalene
p-pentoxy phenyl traselenafulvalene
p-hexoxy phenyl traselenafulvalene
p-heptoxy phenyl traselenafulvalene
p-octoxy phenyl traselenafulvalene
poly(p-methylenoxy-(p'-phenyl traselenafulvalene)styrene)
p-carbomethoxyphenyltetrathiafulvalene
p-carboethoxy phenyl tetrathiafulvalene
p-carbopropoxy phenyl tetrathiafulvalene
p-carbo butoxy phenyl tetrathiafulvalene
p-carbo pentoxy phenyl tetrathiafulvalene
p-carbo hexoxy phenyl tetrathiafulvalene
p-carbo heptoxy phenyl tetrathiafulvalene
p-carbo octoxy phenyl tetrathiafulvalene
poly(p-carboxy-(p'-phenyltetrathiafulvalene) styrene)
p-carbomethoxyphenyltetraselenafulvalene
p-carboethoxy phenyl tetraselenafulvalene
p-carbopropoxy phenyl tetraselenafulvalene
p-carbo butoxy phenyl tetraselenafulvalene
p-carbo pentoxy phenyl tetraselenafulvalene
p-carbo hexoxy phenyl tetraselenafulvalene
p-carbo heptoxy phenyl tetraselenafulvalene
p-carbo octoxy phenyl tetraselenafulvalene
poly(p-carboxy-(p'-phenyltetraselenafulvalene) styrene)

4. Video storage disks according to claim 2 wherein said monofunctionally substituted tetraheterofulvalene is
p-methoxyphenyltetrathiafulvalene and said halocarbon is selected from the group consisting of $CCl_4$, $CBr_4$, $C_2Cl_6$, $C_2Cl_2Br_4$, $C_3Br_4H_4$, $C_2Br_2Cl_4$, $C_2H_2Cl_4$, $C_2Br_6$, $C_3Cl_8$ and $CHBr_3$.

5. Video storage discs according to claim 2 wherein said monofunctionally substituted tetraheterofulvalene is
poly(p-methylenoxy-(p-phenyltetrathiafulvalene) styrene) and said halocarbon is selected from the group consisting of $CCl_4$, $CBr_4$, $C_2Cl_6$, $C_2Cl_2Br_4$, $C_3Br_4H_4$, $C_2Br_2Cl_4$, $C_2H_2Cl_4$, $C_2Br_6$, $C_3Cl_8$ and $CHBr_3$.

6. Video storage disks according to claim 2 wherein said monofunctionally substituted tetraheterofulvalene is
p-methoxyphenyl tetraselenafulvalene and said halocarbon is selected from the group consisting of $CCl_4$, $CBr_4$, $C_2Cl_6$, $C_2Cl_2Br_4$, $C_3Br_4H_4$, $C_2Br_2Cl_4$, $C_2H_2Cl_4$, $C_2Br_6$, $C_3Cl_8$ and $CHBr_3$.

7. Video storage disks according to claim 2 wherein said monofunctionally substituted tetraheterofulvalene is
poly(p-methylenoxy-(p'-phenyl tetraselenafulvalene)styrene) and said halocarbon is selected from the group consisting of $CCl_4$, $CBr_4$, $C_2Cl_6$, $C_2Cl_2Br_4$, $C_3Br_4H_4$, $C_2Br_2Cl_4$, $C_2H_2Cl_4$, $C_2Br_6$, $C_3Cl_8$ and $CHBr_3$.

8. Video storage disks according to claim 2 wherein said monofunctionally substituted tetraheterofulvalene is
p-carbomethoxyphenyltetrathiafulvalne and said halocarbon is selected from the group consisting of $CCl_4$, $CBr_4$, $C_2Cl_6$, $C_2Cl_2Br_4$, $C_3Br_4H_4$, $C_2Br_2Cl_4$, $C_2H_2Cl_4$, $C_2Br_6$, $C_3Cl_8$ and $CHBr_3$.

* * * * *